United States Patent [19]

Alvino

[11] 4,221,840
[45] Sep. 9, 1980

[54] ADHESIVE

[75] Inventor: William M. Alvino, Penn Hills Township, Allegheny County, Pa.

[73] Assignee: Westinghouse Electric Corp., Pittsburgh, Pa.

[21] Appl. No.: 876,818

[22] Filed: Feb. 10, 1978

Related U.S. Application Data

[63] Continuation of Ser. No. 735,719, Oct. 26, 1976, abandoned.

[51] Int. Cl.$^2$ ............................................. C08L 75/00
[52] U.S. Cl. ............................... 428/423.5; 525/126; 525/455; 525/920; 428/473.5
[58] Field of Search ............... 260/859 R; 525/126, 525/455, 920; 428/424

[56] References Cited

U.S. PATENT DOCUMENTS

| | | | |
|---|---|---|---|
| 3,427,366 | 2/1969 | Verdol | 260/859 R |
| 3,431,235 | 5/1969 | Lubowitz | 260/859 R |
| 3,515,772 | 6/1970 | Lubowitz | 260/859 R |
| 3,528,878 | 9/1970 | Lubowitz | 260/859 R |
| 3,616,193 | 10/1971 | Lubowitz | 260/859 R |
| 3,635,891 | 1/1972 | Lubowitz | 260/859 R |
| 3,674,743 | 7/1972 | Verdol | 260/859 R |
| 3,855,379 | 12/1974 | Araki | 260/859 R |
| 3,860,672 | 1/1975 | Lagally | 260/859 R |
| 3,954,686 | 5/1976 | Lagally | 260/859 R |

*Primary Examiner*—Paul Lieberman
*Attorney, Agent, or Firm*—R. D. Fuerle

[57] ABSTRACT

An adhesive composition free of free-radical catalysts is disclosed comprising hydroxy terminated 1,2-polybutadiene, a diisocyanate, and either styrene, vinyl toluene, or a mixture thereof. The adhesive composition is A-staged whence a free-radical catalyst is added. A material such as a film or fibrous reinforcement is coated with the composition and the composition is B-staged. The coated material can be cured during lamination with copper in a heated nip roll.

22 Claims, No Drawings

ADHESIVE

This is a continuation of application Ser. No. 735,719 filed Oct. 26, 1976 now abandoned.

PRIOR ART

U.S. Pat. No. 3,616,193 discloses an adhesive composition which contains hydroxy terminated 1,2-polybutadiene, a diisocyanate, and a free-radical initiator.

BACKGROUND OF THE INVENTION

A printed circuit generally consists of a conductive pattern formed on the surface of an insulating base. This composite is assembled by bonding the components together in a press or in a nip roll through the use of an adhesive.

Adhesives must meet strict requirements if they are to function satisfactorily in a printed circuit. In general, an adhesive should have electrical properties at least equivalent to the insulating base, should form a good bond to copper, should retain the bond through soldering and in service, should not corrode copper, and should have other properties that will enable it to be used either in a nip roll or laminating press type of operation or both.

Because of the large number of different applications for printed circuits, a multitude of adhesive materials have been developed. No one adhesive composition exists that can be used for all applications and each adhesive is designed to function in a given circuit application.

SUMMARY OF THE INVENTION

I have discovered that an adhesive prepared by A-staging a composition which contains hydroxy terminated 1,2-polybutadiene, a diisocyanate, and styrene or vinyl toluene, and then adding a free-radical catalyst, is a superior adhesive with better peel strength than the previously used adhesive.

The adhesive of this invention also meets the requirements needed for applications in circuit boards, including insulating properties, solderability, non-corrosiveness, laminability, and stiffness.

It is one of the advantages of the adhesive of this invention that it can be made fire retardant while an adhesive made from hydroxy terminated 1,2-polybutadiene and a diisocyanate alone cannot be.

DESCRIPTION OF THE INVENTION

An adhesive composition is first prepared of hydroxy terminated 1,2-polybutadiene, a diisocyanate, and a vinyl compound. It is critical that this adhesive composition be free of any free-radical catalyst. I have found that if a free-radical catalyst is present before the adhesive composition is A-staged increased branching and cross-linking occur which reduce solubility to the extent that the composition may gel, but in any case making it difficult to process. The presence of a free-radical catalyst prior to A-staging produces a product which is not the same as the product of this invention. Although not preferred, because the reaction may proceed too rapidly and may even gel, about 0.5 to about 1.5% by weight of a non-free-radical catalyst such as triethylamine or benzyldimethylamine may be present.

The hydroxy terminated 1,2-polybutadienes of this invention have the following structure:

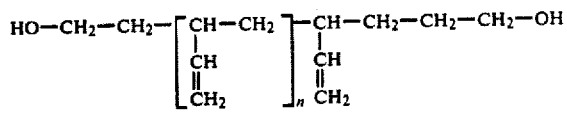

They range in molecular weight from 650 to 3000 and have hydroxy contents of about 0.4 to about 1.3 meq/gm and vinyl contents of about 85 to 90%.

The diisocyanate has the general formula OCN—R—NCO where R is a divalent aromatic or aliphatic radical. Preferably, R is aromatic as those diisocyanates have greater thermal stability, and most preferably R is phenyl as those diisocyanates are readily available and generally more reactive. The preferred phenyl diisocyanates are toluene diisocyanate, 4,4'-diisocyanato diphenyl ether, and diphenyl methane diisocyanate. These three diisocyanates are inexpensive and react readily. Diphenyl methane diisocyanate is especially preferred as it produces polymers which are more linear. The amount of diisocyanate may vary from about a stoichiometric equivalent to react with the hydroxy functionality of the hydroxy terminated 1,2-polybutadiene to form a urethane according to the equation

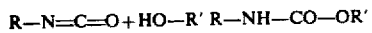

up to about 20 meq (mille equivalents) in excess of stoichiometric. A stoichiometric amount is preferred, however, as there is then less tendency towards cross-linking and gelation. Mixtures of diisocyanates are also contemplated.

The vinyl compound may be styrene, vinyl toluene, or a mixture thereof. Styrene is preferred because it gives better control of the reaction. Other vinyl compounds are not considered to be suitable for various reasons. The vinyl compound is present in a ratio of 1 part by weight hydroxy terminated 1,2-polybutadiene to about 1.0 to about 2 parts by weight vinyl compound. The preferred amount of vinyl compound is 1 part by weight hydroxy terminated 1,2-polybutadiene to about 1.5 parts by weight vinyl compound.

The adhesive composition can be A-staged by at least two different methods. In the first method the adhesive is prepared by dissolving the hydroxy butadiene in the vinyl monomer and heating to 60° C. The diisocyanate is then added and reacted at this temperature for about ½ to 1 hour. The temperature is then raised to 120° C. for another ½ to 1 hour and is then diluted with solvent and cooled to room temperature. This method produces an opaque milky adhesive containing less than one hundred percent solids.

In the second method the adhesive is prepared as above except that after the diisocyanate has been added, the temperature is raised to 80° C. to about 100° C. for about ½ to 2 hours and cooled to room temperature. This method produces a 100% solids adhesive which is clear amber or has a slight haze. It may then be diluted with a solvent if desired. In a third method the adhesive is prepared by heating a mixture of all the ingredients in the presence of a solvent at about 60° C. for about ½ to 1 hour, then at about 80° C. to about 100° C. for about ½ to 2 hours. The first method is preferred because an adhesive composition is obtained that has the best combination of properties resulting from the copolymerization of styrene and the isocyanate-butadiene component. For example, higher molecular weights are obtained, better stiffness properties are imparted to the laminate using the first method and improved elastomeric properties are obtained. Furthermore, by conducting the copolymerization reaction in the absence of a solvent such as toluene, interfering reactions such as chain transfer reactions do not occur. These type of reactions are deleterious to the properties of the adhesive. After the reaction is complete solvent may then be added to adjust the viscosity of the adhesive solution.

Suitable solvents include toluene, benzene, and xylene. Toluene is preferred for its low boiling point and lesser toxicity. Although use of a solvent is optional, a typical adhesive containing a solvent has about 30 to about 60% solids.

The adhesive may be made fire retardant, if desired, by the addition at this stage of a fire retarding agent in an amount of about 60 to about 80% by weight based on solids of the adhesive. To date the only fire retardants which have been found to work well are tris(2,3-dibromopropyl)phosphate and a mixture of antimony trioxide in about 20 to about 40 (preferably 30%) by weight based on solids of adhesive and decabromo diphenyl oxide in about 30 to about 50 (preferably 40%) by weight based on solids of adhesive. The latter mixture is preferred as it gives more fire retardancy.

It is at this stage that the free-radical catalyst is added. Peroxides are preferred for their superior cross-linking efficiency. Suitable free-radical catalysts are illustrated in the examples which follow. The preferred catalyst is t-butyl perbenzoate as it is the most efficient. The free-radical catalyst may be used in an amount of about 1 to about 6% by weight, and about 2% by weight is preferred.

The adhesive is now applied to a substrate and is then B-staged. A suitable substrate may be a surface such as a plastic film, for example a polyester or polyimide film, or a metal surface. The substrate may also be a fibrous reinforcement material such as a polyester, glass, a polyester-glass mixture, or a polyamide.

Coating and B-staging may be achieved by immersing the substrate in the adhesive and passing the coated substrate through rollers separated by about 1 to about 20 mils or other means to remove excess adhesive, followed by heating for about 5 minutes at about 125° C. then for about another 5 minutes at about 150° to about 175° C.

After B-staging, the material can be laminated, for example between sheets of copper, by passing the sheets through a heated nip roll (a rubber roll and a steel roll working together) at about 140 to about 180° C. A heated press at about 160° C., and about 100 psi for about 30 minutes can also be used. A post-cure at about 180° C. for about 10 to about 40 minutes is preferably used to enhance cross-linking.

The following examples further illustrate this invention.

EXAMPLE 1

Fifty grams (59 meq) of a hydroxy terminated polybutadiene having a molecular weight of about 1350, a hydroxy content of 1.18 meq/g, and a vinyl content of 85%, sold by Hystl Development Co. under the trademark "Hystl G-1000" was dissolved in 15 gms of toluene to which was added an equivalent amount (7.43 gms) of 4,4'-diisocyanato diphenyl ether. A white suspension was obtained which was heated to 70° C. for 1 hour. The viscosity of the white opaque solution increased considerably and had to be diluted with 52 gms more of toluene (about 47% solids) to give a more manageable viscosity. Into an aluminum dish was placed 0.5 gms of the above solution and cured as follows:

| 15 min @ 100° C. | tacky |
| 15 min @ 150 | slight tack |
| 5 min @ 200 | very slight tack |
| 2 min @ 275 | no tack |

The adhesive was strongly bonded to the aluminum dish.

EXAMPLE 2

This reaction was performed exactly the same as in EXAMPLE 1 except that 4,4'-diisocyanato diphenyl methane was used as the diisocyanate. The adhesive solution was clear and amber colored. The same results as in EXAMPLE 1 were obtained when the sample was cured in aluminum dish.

EXAMPLE 3

To 20 gms of the resin solution from EXAMPLE 1 and to 20 gms of the resin solution of EXAMPLE 2 was added 0.20 gms (1%) of benzoyl peroxide and mixed thoroughly. A thin film (approx. 1–2 mils) of this solution was applied to Kapton polyimide film by means of a coating bar. The wet adhesive was dried 5 minutes at 100° C. plus 5 minutes at 150° C. The adhesive still had slight tack and was laminated to rolled copper in a heated nip roll at 200° C. A fair bond was obtained.

EXAMPLE 4

To 50 gms of Hystl G-1000 dissolved in 70 gms of toluene was added a slight excess of the equivalent amount of isocyanate required to react with the hydroxy functionality, that is, 7.73 gms 62 meq of 4,4'-diisocyanato diphenyl methane. This is 3 meq in excess of the stoichiometric amount. The ingredients were reacted at 60° C. for 3 hours and a clear pale amber colored solution was obtained. This solution was stable (i.e., it did not gel) for at least 3 weeks. In a similar manner as described in EXAMPLE 3, Kapton film was coated with the adhesive solution, dried and laminated to rolled copper. Peel strengths ranged from 1 to 4 lbs/in. width. Post-curing of the laminated structure for 5 minutes at 200° C. imparted solder resistance to the laminate.

EXAMPLE 5

In a similar manner as described in EXAMPLE 4, 9.9 gms (79 meq) of 4,4'-diisocyanato diphenyl methane was reacted with the Hystl G-1000. This is 20 meq in excess of the stoichiometric amount. The resin solution began to gel the next day and was a firm gel in 48 hours. Laminates were also made as in EXAMPLE 4 using this adhesive solution. Similar results as in EXAMPLE 4 were obtained.

EXAMPLE 6

In this example, 8.8 gms (70 meq) of 4,4'-diisocyanto diphenyl methane were reacted with Hystl G-1000. This is 11 meq in excess of the stoichiometric amount. The resin solution began to gel 7 days later. Laminates were prepared using this adhesive solution with results similar to EXAMPLE 4.

EXAMPLES 1 through 6 deal with the reaction of the hydroxy polybutadiene plus two different isocyanates. Fair bonds can be obtained with Kapton film to rolled copper. These experiments also show how the amounts of isocyanate affects the stability of the adhesive solution, as summarized in the following table.

| EFFECT OF AMOUNT OF ISOCYANATE ON STABILITY OF RESIN SOLUTION | | | | |
|---|---|---|---|---|
| Milliequivalents NCO | 59 | 62 | 70 | 79 |
| Excess meq NCO | 0 | 3 | 11 | 20 |
| Gel Time | none | 21 days | 7 days | 1 day |

EXAMPLE 7

This example shows the effect of different peroxide catalysts on the cure, bond strength, and solder resistance of Kapton film-rolled copper laminates.

To 50 gms of Hystl G-1000 dissolved in 70 gms of toluene was added 7.4 gms (stoichiometric amount) of 4,4'-diisocyanato diphenyl methane and heated for 2 hours at 70° C. A clear pale amber viscous solution was obtained (45% solids). To aliquots of the above solution was added 2% (based on weight of Hystl G-1000) of different peroxides and mixed thoroughly at room temperature. These solutions were applied to Kapton film (a polyimide sold by Dupont) by means of a coating bar and dried in an oven to B-stage the adhesive. The samples were then laminated to rolled copper in a heated nip roll at 190° C. The results are shown in the following table.

EXAMPLE 8

Two hundred grams of Hystl G-1000 dissolved in 400 gms of toluene and 2 gms triethylamine were heated to 75° C. 29.5 gms (the stoichiometric amount) of 4,4'-diisocyanato diphenyl methane was added to the solution which was maintained at 80° C. for 2 hours with stirring. The clear pale green solution was cooled to room temperature. The solids content was 36%. To this mixture was added 4.5 gms of t-butyl peroxide (2.3% based on weight of Hystl G-1000) and thoroughly mixed at room temperature. This adhesive mixture was then applied to two types of fabrics: (1) a Dacron-107 glass polyethylene terephthalate tri-ply construction and, (2) a diagonally apertured polyester sold by Burlington Industries, Inc. as "Nexus 1012/48." This application included drawing the fabric through the adhesive solution and pulling the coated fabric through two grooved rods having a gap of about 20 mils. Good wetting and impregnation of the fabric was obtained. The coated fabrics were then dried in an oven (5 min 125° C.) to a B-staged condition and laminated to electrodeposited copper in a press (30 min 225° C. 100 psi) and in a heated nip roll (180° C.). The results of tests run on these samples are shown in the following table.

| Fabric | Tack | PROPERTIES OF LAMINATES FROM SOLVENT ADHESIVE FORMULATIONS | | | | |
|---|---|---|---|---|---|---|
| | | Adhesive Thickness | Tear Strength | Press | Peel Strength | Solder Test |
| Dacron Glass | Slight | 1 mil | 1.5 lbs | 30 min 225° C. 100 psi | 3 lbs | passed |
| Dacron Apertured 1012-Nexus (a polyester cloth sold by Burlington Industries, Inc.) | Slight | 4 mils | 1.5 lbs | 30 min 225° C. | 11 lbs | passed |

EXAMPLE 9

This example is exactly the same as EXAMPLE 8 except only 260 gms of toluene were added making the total solids content 47%. The results of tests on laminates made from this solution are shown in the following table.

| EFFECT OF PEROXIDE CATALYST ON ADHESIVE PROPERTIES | | | | |
|---|---|---|---|---|
| Peroxide | B-Stage Condition | Postcure | Bond Strength | Solder Test |
| t-butyl perbenzoate | 5 min 100° C. | 10 min 200° C. | fair | passed |
| benzoyl peroxide | " | 5 min 200° C. | fair | failed |
| methyl ethyl ketone peroxide | " | " | good | failed |
| t-butyl peroxide | " | " | good | failed |
| 2,5-dimethyl-2,5-bis (2-ethylhexanoylperoxy) hexane | " | — | poor | — |
| co-t-butyl-o-isopropyl monoperoxy carbonate | " | 5 min 200° C. | good | failed |
| Benzoyl peroxide | 5 min 125° C. | 10 min 200° C. | fair | failed |
| methyl ethyl ketone peroxide | " | " | good | passed |
| t-butyl peroxide | " | 30 min 200° C. | good | passed |

PROPERTIES OF LAMINATES FROM
SOLVENT ADHESIVE FORMULATIONS

| Fabric | Tack | Adhesive Thickness | Tear Strength | Nip Roll | Post-cure | Peel Strength | Solder Test |
|---|---|---|---|---|---|---|---|
| Apertured 1012-Nexus | Slight | 4 mils | 1.5 lbs | 180° C. | 30 min 185° C. | 13 | passed |
| " | " | 3 mil | " | " | none | 12 | failed |
| " | " | " | " | " | " | 10 | " |

EXAMPLE 10

This example illustrates a 100% solids adhesive composition using no t-amine catalyst.

Two hundred grams of Hystl G-1000 were dissolved in 200 gms of styrene and heated to 50° C. At this point 29.4 gms (stoichiometric amount) of 4,4'-diisocyanato diphenyl methane was added and the temperature raised to 70°-75° C. for about 1½ hours and cooled at room temperature. The solution, which was hazy at the beginning, was clear and pale green in color and viscous. t-butyl peroxide (4% based on combined weight of Hystl and styrene) was added to the solution and mixed thoroughly at room temperature. The adhesive was applied to two types of fabrics: (1) a Dacron-107 glass polyethylene terephthalate tri-ply construction, and (2) a calendared non-apertured polyester designated "Nexus." The impregnation and lamination was carried out as described in EXAMPLE 8. The results are shown in the following table.

PROPERTIES OF LAMINATES FROM
100% SOLIDS ADHESIVE FORMULATIONS

| Fabric | Tack | Adhesive Thickness | Tear Strength | Press | Nip Roll | Peel Strength | Solder Test |
|---|---|---|---|---|---|---|---|
| Calendered Nexus | Slight | 2 mils | 1 lb | — | 190° C. | 8 lbs | failed Nexus shrinks |
| Calendered Nexus | " | " | " | 30 min 350° F. 100 psi | — | 8 lbs | failed Nexus shrinks |
| Dacron-glass-Dacron | " | " | 3 lbs | — | 190° C. | 5 lbs | failed Nexus shrinks |
| Dacron-glass-Dacron | " | " | " | 30 min 350° F. 100 psi | — | 6 lbs | failed Nexus shrinks |

EXAMPLE 11

This example illustrates a 100% solids adhesive composition using tertiary amine catalyst.

To 100 gms of Hystl G-1000 dissolved in 150 gms of styrene containing 1 gm of benzyl dimethylamine (BDMA) and heated to 80° C. was added 14.8 gms (stoichiometric amount) of 4,4'-diisocyanato diphenyl methane. The reaction was continued at 80° C. for 2 hours and cooled to room temperature. A clear, amber viscous solution was obtained. Calendered non-apertured "Nexus" was coated and laminated to electrodeposited copper (as described in EXAMPLE 8). The results are given in the following table.

| Tack | Adhesive Thickness | Tear Strength | Press | Nip Roll | Peel Strength | Solder Test |
|---|---|---|---|---|---|---|
| Slight | 2 mils | 1 lb | 30 min 350° F. 100 psi | — | 7 lbs | failed "Nexus" shrinks |
| " | " | " | — | 190° C. | 7 lbs | " |

EXAMPLE 12

To 100 gms of Hystl G-1000 dissolved in 200 gms of styrene containing 1 gm of BDMA and heated to 70° C. was added 14.8 gms of 4,4'-diisocyanato diphenyl methane. The temperature was raised to 80°-90° C. and maintained for 2 hours. The solution was cooled to room temperature and different peroxides (2% based on weight of Hystl and styrene) were added to aliquots of the above solution.

0.5 gms of each of the solutions was placed in an aluminum dish and cured at various temperatures to determine the cure properties. The results are shown in the following table.

| Peroxide | Solution Characteristic | Cure, 5 Min | | | |
|---|---|---|---|---|---|
| | | 110° C. | 135° C. | 150° C. | 200° C. |
| t-butyl peroxide | Hazy, green solution | Slight tack | Slight tack | Slight tack | no tack |
| t-butyl perbenzoate | Hazy, yellow solution | Slight tack | Slight tack | Slight tack | no tack |
| co-t-butyl-o-isopropyl monoperoxy carbonate | " | Slight tack | Slight tack | Slight tack | no tack |
| 2,5-dimethyl-2,5-bis (2-ethyl hexanoylperoxy) hexane | Hazy, whitish solution, became a solid mass in 8 days | Slight tack | Little tack | Little tack | no tack |

EXAMPLE 13

The following series of experiments deal with 100% solids systems, the effect of different peroxide catalysts on the cure, the properties of coated fabrics, and effect of amine catalyst on solution properties of adhesive.

To 300 gms of Hystl G-1000 dissolved in 450 gms of styrene and 2 gms of BDMA and heated to 80° C. is added 44.25 gms (stoichiometric amount) of 4,4'-diisocyanato diphenyl methane. The mixture is maintained at 80° C. for 2 hours and cooled to room temperature. A clear amber colored viscous solution was obtained. Different peroxides (4% based on combined weight of Hystl and styrene) were added to aliquots of the above solution. Calendered "Nexus" was impregnated with the above solutions according to the procedure outlined in experiments 16–17 and laminated to electrodeposited copper in a press for 30 mins 350° F. 100 psi. The results of these experiments are shown in the following table.

| Peroxide | Tack | Adhesive Thickness | Tear Strength | Peel Strength | Solder Test |
|---|---|---|---|---|---|
| t-butyl perbenzoate | Slight | 1 mil | 1 lb | 9 lbs | failed Nexus shrinks |
| 2,5-dimethyl-2,5-bis (tert butylperoxy) hexane | None | " | " | 3 lbs | failed Nexus shrinks |
| 2,5-dimethyl-2,5-bis (2-ethyl hexanoylperoxy) hexane | " | " | " | " | passed |

The above solutions gelled in two days at room temperature.

EXAMPLE 14

This series of experiments deals with the effects of peroxide catalysts on the cure time and temperature of a 100% solids adhesive system.

Two hundred grams of Hystl G-1000 as dissolved in 200 mgs of styrene and heated to 50° C. At this point 29.4 gms (stoichiometric amount) of 4,4'-diisocyanato diphenyl methane was added and the temperature raised to 70°–75° C. for about 1-½ hours. After cooling to room temperature, a viscous clear pale green solution was obtained. To aliquots of this solution was added 4% of different peroxide catalysts and 0.5 gm of the resulting solutions was placed in aluminum dishes and cured. The results are shown in the following table.

EXAMPLE 15

These series of experiments will show how the reaction temperature affects the properties of the adhesive formulation.

Four batches each containing 20 gms of Hystl G-1000 were dissolved in 30 gms of styrene to obtain clear colorless solutions which were heated to 60° C. at which time 2.95 gms (stoichiometric amount ) of 4,4'-diisocyanato diphenyl methane were added to each batch. Each batch was reacted at temperatures of 80°, 90°, 100°, and 120° C. for 2 hours and cooled to room temperature. The following table gives the results:

| Item | Reaction Temperature | Gardner Viscosity | Comments |
|---|---|---|---|
| A | 80° C. | O | Clear pale amber solution |
| B | 90° C. | W− | " |
| C | 100° C. | V | Hazy amber solution |
| D | 120° C. | Z6+ | Opaque white solution-rubbery-like |

Each of these solutions was mixed with t-butyl perbenzoate (2% based on total solids content) at room temperature. Calendered "Nexus" as impregnated with each of the above solutions by immersing the fabric in the solutions and drawing through a pair of grooved rods (20 mil gap). The coated fabric was B-staged 5 min 125° C. and laminated to electrodeposited copper in a heated nip roll at 185° C. The results of these tests are shown in the following table.

| Item | Tack | Flow Characteristics in Nip Roll | Peel Strength | Solder Test |
|---|---|---|---|---|
| A | Slight | adhesive flows readily | 3 lbs | passed |
| B | " | " | " | " |
| C | " | less flow | 6 lbs | " |
| D | very | negligible | 10 lbs | " |

| Peroxide | Cure | Tack | Comments |
|---|---|---|---|
| t-butyl perbenzoate | 5 min 135° C. | slight | failed solder test |
| | 5 min 150° C. | " | " |
| | 5 min 200° C. | none | passed solder |
| | 1 hr 125° C. + 2 days at RT | slight | " |
| Di-cumyl peroxide | same as above | " | same as above except failed solder after 1 hour 125° C. + 2 days at RT |
| 1,1-bis(t-butylperoxy) 3,3,5-trimethylcyclohexane | same as A | slight | same as B |
| co-t-butyl-o-isopropyl monoperoxy carbonate | " | " | same as A |
| 2,5-dimethyl-2,5-bis(2-ethyl hexanoylperoxy) hexane | " | none | all samples passed solder test except the 5 min 135° C. sample |

Curing of the samples takes place at room temperature after activation of the peroxide catalysts so that they pass the solder tests.

| Item | Tack | Flow Characteristics in Nip Roll | Peel Strength | Solder Test |
|---|---|---|---|---|
| | little | | | |

Samples without catalyst all failed in solder test. The samples were tested after curing 4 days at room temperature.

In other series of experiments using the above formulations, calendered "Nexus" and Dacron-glass-Dacron were coated and the B-stage condition was 5 min 125° C. + 5 min 150° C. This was done to reduce the flow of the adhesive in the nip roll. The results are shown in the following table. The samples were postcured in an oven for 40 mins at 180° C. prior to the solder test.

| Item | Flow Characteristics in Nip Roll | Peel Strength | Solder Test |
|---|---|---|---|
| A | adhesive flows but less than 1st time | 4 lbs | passed |
| B | adhesive flows but less than 1st time | " | " |
| C | very little | 7 lbs | " |
| D | none | 10 lbs | " |

EXAMPLE 16

These experiments show the effect of toluene on the reaction product of the adhesive composition. Two reactions were run each containing identical reactants, except one of the reactions contained toluene.

Twenty grams each of Hystl G-1000 were dissolved in 30 gms of styrene to produce solutions A and B. Solution B was further diluted with 50 gms of toluene and both solutions (A and B) were heated to 60° C. to produce a clear pale amber solution. 2.95 gms of 4,4'-diisocyanato diphenyl methane was added to each solution and the temperature raised 120° C. and held for 2 hours. At the end of the reaction, solution A was opaque and milky in appearance. It was diluted with 50 gms of toluene due to the high viscosity and rubbery-like properties of the solution. Solution B was hazy and not nearly as viscous as solution A. After standing for two days, solution B separated into two layers; a top layer that was clear and a milky bottom layer. Solution A remained a one phase homogeneous solution. Solution B was reheated an additional 4 hours at 120° C. and gradually became more milky in appearance but never the appearance of solution A.

EXAMPLE 17

This example illustrates effect of t-amines on reaction product of Hystl, styrene.

Ten grams of Hystl G-1000 was dissolved in 15 gms of styrene and 1 gm triethylamine and heated to 60° C. Then 1.47 gms of 4,4'-diisocyanato diphenyl methane was added and the temperature raised to 85°-90° C. for 2 hours.

In another experiment, the triethylamine was replaced with benzyldimethylamine. After heating at 60° C. for 2 hours, the color and viscosity of each of the solutions was recorded and the temperature raised to 120° C. for 2 more hours. Again the viscosity and color were recorded. The following table gives the results.

Viscosity is on the Gardner-Holtz scale.

| t-amine | After 2 Hrs at 85-90° C. | | After 2 Hrs at 120° C. | |
|---|---|---|---|---|
| | Color | Viscosity | Color | Viscosity |
| Triethylamine | Clear Amber | Z2 | Clear Amber | Z2 |
| Benzyldimethylamine | Clear Amber | X | Milky | Z6+ |

EXAMPLE 18

Formulation A (Reacted at 100° C.-100% Solids)

Three hundred grams of Hystl G-1000 were dissolved in 450 gms of styrene in a 3 neck flask fitted with a condenser, stirrer and thermometer and heated to 60° C. (clear pale amber solution). 44.25 gms (stoichiometric amount) of 4,4'-diisocyanato diphenyl methane was added and the temperature raised to 100° C. for 2 hours. The solution was cooled to room temperature. The cloudy solution had a Gardner viscosity of W at 100% solids.

Formulation B (Reacted at 120° C.-72% Solids)

Identical to formulation A except reaction temperature was 120° C. The milky solution was diluted with toluene at the end of the reaction to give 72% solids and a Gardner viscosity of V.

Two percent (based on total adhesive solids) of t-butyl perbenzoate was added to the formulations and various fibrous reinforcements were impregnated with the above formulations by dipping them into the solutions and drawing the adhesive coated fabric through a pair of grooved rods having a gap of 20 mils. The coated fabrics were dried in an oven for 6 minutes at 125° C. plus 5 minutes at 150° C. to bring them to a B-staged condition. They were then laminated to electrodeposited copper in a heated nip roll (180° C.) and postcured in an oven for 30 minutes at 180° C. In addition, samples were laminated in a press for 30 minutes at 350° F. at 100 psi. Properties of these laminates were measured and the results shown in the following table.

| PROPERTIES OF LAMINATES PREPARED FROM ADHESIVE FORMULATIONS HEATED AT 100° and 120° C. | | | | | |
|---|---|---|---|---|---|
| Formulation | Fabric | Total Adhesive Thickness | Nip Roll | Press | Peel Strength |
| A | Calendered Nexus | 4 mils | Yes | — | 6.5 |
| 100% solids | Apertured Nexus | 4 | " | — | 6.5 |
| Reaction | Dacron-glass-Dacron | 4 | " | — | 6.5 |
| Temp. 100° C. | Dralon T (polyacrylonitrile) | 3 | " | — | 4 |
| | Oxidized Dralon T | 2 | " | — | 6 |
| | Calendered Nexus | 5 | — | Yes | 8 |
| | Apertured Nexus | 5 | — | " | 9 |
| | Dacron-glass-Dacron | 4 | — | " | 9.5 |
| | Dralon T | 3 | — | " | 7 |

PROPERTIES OF LAMINATES PREPARED FROM ADHESIVE FORMULATIONS HEATED AT 100° and 120° C.
-continued

| Formulation | Fabric | Total Adhesive Thickness | Nip Roll | Press | Peel Strength |
|---|---|---|---|---|---|
| | Oxidized Dralon T | 1 | — | " | 8 |
| B | Calendered Nexus | 2 | Yes | — | 8 |
| 72% solids | Apertured Nexus | 2 | " | — | 6 |
| Reaction | Dacron-glass-Dacron | 1 | " | — | 5 |
| Temp. 120° C. | Dralon T | 2 | " | — | 5 |
| | Oxidized Dralon T | 1.5 | " | — | 4 |
| | Calendered Nexus | 5 | — | Yes | 7.5 |
| | Apertured Nexus | 2.5 | — | " | 6 |
| | Dacron-glass-Dacron | 1.5 | — | " | 8 |
| | Dralon T | 4 | — | " | 4 |
| | Oxidized Dralon T | 2 | — | " | 3 |

All of the above samples passed the solder test.

EXAMPLE 19

These series of experiments deal with the preparation of fire retardant adhesive formulations. Fire retardancy in these tests was determined by measuring the oxygen index value of the adhesive coated sample. These values are obtained using a General Electric Oxygen Index Flammability Gauge. A ½"×4" strip of the sample was placed in the flame chamber and ignited and the flame removed. The oxygen index is the minimum percentage of oxygen in nitrogen which will cause the sample to burn 3". The adhesive used was from EXAMPLE 18, part B.

A
| | |
|---|---|
| Adhesive | 50 gms |
| t-butyl perbenzoate | 0.72 gms (2% based on solids) |
| zinc borate | 10.8 gms (30% based on solids) |

B
| | |
|---|---|
| Adhesive | 50 |
| t-butyl perbenzoate | 0.72 |
| chlorinated biphenyl | 10.8 also 21.6 gms (60%) |

C
| | |
|---|---|
| Adhesive | 50 |
| t-butyl perbenzoate | 0.72 |
| tris(2,3-dibromopropyl) phosphate | 21.6 (30%) <br> 43.2 (60%) |

D
| | |
|---|---|
| Adhesive | 50 |
| t-butyl perbenzoate | 0.72 |
| alumina trihydrate | 10.8 also 21.6% |

E
| | |
|---|---|
| Adhesive | 50 |
| t-butyl perbenzoate | 0.72 |
| tetrabromophthalic anhydride | 10.8 |

F
| | |
|---|---|
| Adhesive | 50 |
| t-butyl perbenzoate | 0.72 |
| hexachlorobutadiene | 18 (50%) |

G
| | |
|---|---|
| Adhesive | 50 |
| t-butyl perbenzoate | 0.72 |
| bis(beta chloro ethyl vinyl) phosphate | 10.8 also 21.6 (60%) |

Each of the above formulations was applied to calendered "Nexus" and dried 5 minutes at 125° plus 5 minutes at 150° C. Each sample was postcured 30 minutes at 180° C. Adhesive thickness was about 2 mils. The results of the flammability tests are shown in the following table.

FLAMMABILITY TEST RESULTS

| Item | Additive | | LOI Value |
|---|---|---|---|
| A | zinc borate | | 22 |
| B | chlorinated biphenyl | | 22 |
| C | tris(2,3-dibromopropyl) phosphate | 30% | 26 |
| | | 60% | 32 |
| D | alumina trihydrate | | 22 |
| E | tetrabromophthalic anhydride | | 22 |
| F | hexachlorobutadiene | | 22 |
| G | bis(beta chloro ethyl vinyl) phosphate | | 22 |

Since LOI values must be greater than 28 to be acceptable and the only additive in this example that imparts fire retardancy to the coated fabric is tris(2,3-dibromopropyl) phosphate.

Additional examples of fire retardant adhesives are given in the following example, part H.

EXAMPLE 20

The following experiments relate to the preparation of the adhesive and the method of application for preparing laminates as well as fire retardant compositions.

Part A

To determine effect of heating styrene alone at 120° C., i.e., the condition used to prepare the adhesive.

130 g of styrene was added to a three neck flask equipped with a stirrer, thermometer, and condenser and heated at 120° C. for 2 hours. At the end of the reaction the flask was cooled to room temperature. The clear colorless liquid was quite viscous (Gardner Viscosity=Y).

Part B

To determine effect of heating Hystl G-1000 plus methylene diisocyanate (MDI) at 120° C.

123 g of Hystl G-1000 having an hydroxyl equivalent of 120 meq/g was added to a three neck flask equipped with a stirrer, thermometer, and condenser. It was heated to 60° C. and 18.5 g (a stoichiometric equivalent) of MDI was added. The temperature was raised and the reaction mixture became viscous. Toluene (50 g) was added to facilitate stirring and the reaction heated to 120° C. for 2 hours. A clear pale amber viscous solution was obtained (Gardner Viscosity>Z10). The reaction mixture was diluted with 180 g of toluene to obtain a more manageable viscosity.

Part C

To determine the effect of varying the Hystl to styrene ratio.

(a) 40 g of Hystl G-1000 was mixed with 60 g of styrene in a three neck flask equipped with a stirrer, thermometer, condenser and flow tube (62 mm×4 mm ID) to monitor the change in viscosity of the reaction. This mixture was heated to 60° C and 5.9 g (the stoichiometric amount) of MDI was added and heated to 120° C. over a ½ hour period. The reaction was kept at 120° C. for 1½ hours at which time the viscosity flow measured 6 secs. The solution was viscous and milky in color. It was diluted with 71 g of toluene (Gardner Viscosity=J). This reaction corresponds to a Hystl to styrene ratio of 1:15. Two other reactions were performed exactly like this experiment but the ratio was altered, i.e., 1:1 and 1:0.5.

(b) 50 gms of Hystl G-1000 and 50 gms of styrene were mixed in a flask as in Part A. Reaction was carried out as described in Part A. The reaction washeld at 120° C. for 30 minutes. The viscosity flow at the end of reaction was 8 secs and the solution was hazy-amber colored. It was not milky white like the solution in experiment Part C(a). The Gardner Viscosity after cooling to room temperature was V at 60% solids. This reaction corresponds to a Hystl to styrene ratio of 1 to 1.

(c) 70 g of Hystl G-1000 and 35 g of styrene were mixed in a flask as in Part A and the reaction was carried out accordingly. The reaction was held at 120° C. for 18 minutes. The viscosity flow was not measured due to the high viscosity of the mixture. It was diluted with toluene to give a 60% solids solution having a Gardner Viscosity of Z6. Dilution to 42% solids gave an X viscosity. The solution was clear amber with only a faint haze. This reaction corresponds to a Hystl to styrene ratio of 1 to 0.5.

A summary of the properties of these reactions are presented in the following table.

| SOLUTION PROPERTIES OF ADHESIVE COMPOSITIONS EFFECT OF ALTERING THE HYSTL TO STYRENE RATIO | | | | |
|---|---|---|---|---|
| Experiment | Hystl/Styrene Ratio | Solids | Gardner Viscosity | Color |
| a | 1:1.5 | 60 | J | opaque, milky |
| b | 1:1 | 60 | V | translucent, hazy |
| c | 1:0.5 | 60 | Z6 | clear, slight haze |

After standing 4 days at room temperature, the reaction mixtures gelled.

Part D

Properties of copper-clad laminates prepared from the resin in Part B. Two fabrics, Dac-Glass and Dacron-glass-Dacron were impregnated with the adhesive resin containing a peroxide catalyst and dried 5 minutes 125° C. plus 5 minutes 150° C. They were laminated to EDTC copper in a heated nip roll (175° C.) and post cured for 10 minutes at 175° C. The peel strength on Dac-Glass and Dacron-Glass-Dacron were 4 and 5 lbs/inch, respectively. Both samples passed the solder test and both had LOI (flammability) values of 22.

Part E

Dac-Glass was coated with the adhesive solutions prepared in Part C and laminated to EDTC copper as described in Part D. All laminates had equivalent peel strength about 3½–4½ lbs/inch. All passed the solder test and all had LOI values of 22.

Part F

To determine the stability of the adhesive composition.

80 g of Hystl G-1000 (1.18 meq/g of OH ) was mixed with 120 g of styrene in a three neck flask equipped with a stirrer, thermometer, condenser, and flow tube for measuring viscosity. The contents were heated to 60° C. and 11.75 g of MDI was added. The temperature was raised to 120° C. over a 45 minute period and held at 120° C. for 45 minutes. The viscosity flow measured 5½ secs. Then 100 g of toluene was added and the reaction mixture was cooled to room temperature. The milky white viscous solution, 68% solids, had a Gardner Viscosity of R. The viscosity of this solution was monitored and the results shown in the following table.

| STABILITY OF ADHESIVE COMPOSITIONS | | |
|---|---|---|
| Time, Days | Gardner Viscosity | Comments |
| 0 | R | Adhesive becomes gel like at |
| 1 | U | the higher viscosities but it |
| 2 | W | can be broken up or dissolved |
| 3 | Y− | with stirring. It is still |
| 4 | Y+ | suitable for use. |
| 7 | Z1 | |
| 11 | Z2 | |
| 15 | Z5 | |

Part G

Effect of Adhesive Thickness. The following fabrics were impregnated with the adhesive composition in Part F. Dacron-Glass, Dacron-Glass-Dacron, Nomex 287.2, (aromatic polyimide), Nomex 296.2 (aromatic polyimide). The adhesive contained 2% t-butyl perbenzoate as a catalyst. The fabrics were dipped into the adhesive solution for 1 minute and pulled through a pair of Mayer rods. They were dried 5 minutes 125° C. plus 5 minutes 150° C. and laminated to EDTC copper in a heated nip roll (175° C.) and post cured in an oven for 10 minutes at 175° C. The properties of these laminates are shown in the following table.

| EFFECT OF ADHESIVE THICKNESS | | | |
|---|---|---|---|
| Fabric | Total Adhesive Thickness | Peel Strength | Tear Strength |
| Dacron-Glass | 1.5 mils | 2 | 4 |
| " | 2.0 | 4 | 4 |
| " | 4.0 | 7 | |
| Dacron-Glass-Dacron | 1.5 | 4 | 2 |
| Dacron-Glass-Dacron | 2.0 | 6 | 2 |
| Dacron-Glass-Dacron | 4.0 | 10 | |
| Aromatic Polyamide sold by Kendall Co. as "Nomex 287.2" | 1.5 | 3 | ½ |
| Aromatic Polyamide sold by Kendall Co. as "Nomex 287.2" | 2.0 | 5 | |
| Aromatic Polyamide sold by Kendall Co. as "Nomex 296.2" | 1.5 | 4 | ½ |
| Aromatic Polyamide sold by Kendall Co. | | | |

| EFFECT OF ADHESIVE THICKNESS | | | |
|---|---|---|---|
| Fabric | Total Adhesive Thickness | Peel Strength | Tear Strength |
| as "Nomex 296.2" | 2.0 | 5 | |

The thickness of the adhesive coating did not appear to adversely affect the final thickness of the laminate due to the fact that the adhesive is squeezed in the nip and flows easily for spreading over the contact surfaces.

Part H

A number of compositions were prepared containing various fire retardant additives. These compositions and their flammability characteristics (LOI values) are shown in the following table.

EXAMPLE 21

300 gms of Hystl G-1000 were mixed with 450 gms of styrene and heated to 60° C. in a three neck flask equipped with a stirrer, thermometer and condenser. At 60° C., 45 gms of 4,4'-diisocyanato diphenyl methane was added and heated to 120° C. for 2 hours. It was diluted with 300 gms of toluene to obtain a viscous milky colored solution, solids 73%, viscosity V. To this slution was added 2% (based on solids) of t-butyl perbenzoate and mixed thoroughly. The solution was applied to various films and fabrics by using groved meyer rods to control thickness of the adhesives. The coated materials were dried 5 minutes 125° C. and 5 minutes 150° C. and laminated to copper in a heated nip roll (180° C.). Half the samples were post cured 30 minutes 180° C. and half were left to cure at room temperature for several days. Properties of the laminates were mea-

| FIRE RETARDANT ADHESIVE COMPOSITIONS | | |
|---|---|---|
| Composition | Fabric | LOI |
| Hystl G-1000 + MDI | Dacron-Glass | 22 |
| "          +" | Dacron-Glass-Dacron | 22 |
| "          +" | Aromatic Polyamide ("Nomex") | 22 |
| Hystl G-1000 + MDI + Sb$_2$O$_3$ (30%) + decabromo diphenyloxide (30%) | Dacron-Glass | 26 |
| Hystl G-1000 + MDI + Sb$_2$O$_3$ (30%) + decabromo diphenyloxide (40%) | Dacron-Glass | 28 |
| Hystl G-1000 MDI + Sb$_2$O$_3$ (30%) + decabromo diphenyloxide (40%) | Dacron-Glass-Dacron | 28 |
| Hystl G-1000 + MDI + Styrene + Sb$_2$O$_3$ (30%) + decabromo diphenyloxide (30%) | Dacron-Glass | 27 |
| Hystl G-1000 + MDI + Styrene + Sb$_2$O$_3$ (30%) + decabromo diphenyloxide (40%) | Dacron-Glass | 37 |
| Hystl G-1000 + MDI + Styrene + Sb$_2$O$_3$ (30%) + decabromo diphenyloxide (40%) | Dacron-Glass-Dacron | 34 |
| Hystl G-1000 + MDI + Sb$_2$O$_3$ (30%) + decabromo diphenyloxide (30%) | Dacron-Glass-Dacron | 34 |
| Hystl G-1000 MDI + Sb$_2$O$_3$ (30%) + decabromo diphenyloxide (30%) | Dacron-Glass | 26 |
| Hystl G-1000 MDI + Sb$_2$O$_3$ (30%) + decabromo diphenyloxide (30%) | Aromatic Polyimide ("Nomex") | 31 |
| Hystl G-1000 + MDI + Sb$_2$O$_3$ (40%) + decabromo diphenyloxide (30%) | Dacron-Glass | 26–28 |
| Hystl G-1000 + MDI + Sb$_2$O$_3$ (40%) + decabromo diphenyloxide (30%) | Dacron-Glass | 26–28 | sured and are shown in the following table.

| PROPERTIES OF COPPER-CLAD LAMINATES | | | | | |
|---|---|---|---|---|---|
| Film/Fabric | Copper | Adhesive Thickness | Tear Strength | Peel Strength | Solder Resistance |
| Kapton Film (2 mils) | Dark 2 oz EDTA | 1.8 mils | — | 5 | No |
| | | | | 8* | Yes* |
| | Light 1 oz EDTC | | | 3 | No |
| | | | | 6* | Yes* |
| Mylar Film (polyimide) (2 mils) | Dark 2 oz EDTA | 2.5 | — | 3 | No |
| | | | | 6* | Yes* |
| | Light 1 oz EDTC | | | 5 | No |
| | | | | 8* | Yes* |
| Calendered Nexus (4 mils) | Dark 2 oz EDTA | 3.0 | ¼ lb. | 9 | No |
| | | | | 10* | Yes* |
| | Light 1 oz EDTC | | | 7 | No |
| | | | | 6* | Yes* |
| Non-calendered Nexus (6 mils) | Dark 2 oz EDTA | 3.6 | ¼ lb. | 12 | No |
| | | | | 7* | Yes* |
| | Light 1 oz EDTC | | | 10 | No |
| | | | | 9* | Yes* |
| Dacron-107 Glass-Dacron (6 mils) | Dark 2 oz EDTA | 1.8 | 1 lb. | 8 | Yes |
| | | | | 8* | Yes* |
| | Light 1 oz EDTC | | | 7 | Yes |

| PROPERTIES OF COPPER-CLAD LAMINATES | | | | | |
|---|---|---|---|---|---|
| Film/Fabric | Copper | Adhesive Thickness | Tear Strength | Peel Strength | Solder Resistance |
| | | | | 5* | Yes* |

*Post cured 40 minutes 180° C.
"EDTA" means electrodeposited copper with treatment A
"EDTC" means electrodeposited copper with treatment C.

EXAMPLE 22

The adhesive prepared in Example 21 was applied to 2 pieces of 5 mil Kapton (polyimide film), and dried 5 minutes at 125° C. plus 5 minutes at 150° C. Adhesive thickness was 1.5 mils. The coated Kapton was laminated to itself in a heated nip roll (180° C.) and post cured for 40 minutes at 180° C. The resulting laminate was quite flexible and had a peel strength of 7 lbs/inch width.

Several 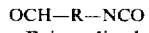 inch wide strips of the laminated films were immersed in Turbo Oil 2380 (Exxon) and heated at 280°-295° C. for 24 hours under nitrogen. Upon inspection, no blisters were observed and no delamination occurred. When tested for peel strength, the Kapton film tore in the grips of the tensile machine. The laminate could be bent through an angle of about 150 degrees without cracking. No sign of chemical attack was observed. Very slight shrinkage of the adhesive was noticed at the edges of the laminate but did not seen to affect the strength of the laminate itself.

I claim:

1. An A-staged reaction product made by reacting to the A-stage by heating at about 60° C. for about ½ to about 1 hour followed by heating at about 120° C. until the viscosity is less than 8 secons measured in a 62 mm × 4 mm I.D. flow tube at 120° C.,
   (A) hydroxy terminated 1,2-polybutadiene; and
   (B) about a stoichiometric equivalent to react with the hydroxy functionality of said hydroxy terminated 1,2-polybutadiene up to about 20 meq in excess of said stoichiometric equivalent, of a diisocyanate having the general formula $$OCH-R-NCO$$

where R is a divalent aromatic or aliphatic radical; and
   (C) a vinyl compound selected from the group consisting of styrene, vinyl toluene, and mixtures thereof in a ratio of about 1.0 to about 2 parts by weight per each part by weight of said hydroxy terminated 1,2-polybutadiene, said A-staged reaction product being free of any free-radical catalyst.

2. A reaction product according to claim 1 wherein the amount of said diisocyanate is about stoichiometric.

3. A reaction product according to claim 1 wherein the weight ratio of said vinyl compound to said hydroxy terminated 1,2-polybutadiene is about 1.5.

4. A reaction product according to claim 1 wherein said diisocyanate is selected from the group consisting of toluene diisocyanate, 4,4'-diisocyanato diphenyl ether, diphenyl methane diisocyanate, and mixtures thereof.

5. A reaction product according to claim 4 wherein said diisocyanate is diphenyl methane diisocyanate.

6. A reaction product according to claim 1 wherein said vinyl compound is styrene.

7. A reaction product according to claim 1 which includes about 0.5 to about 1.5% by weight of a non-free radical catalyst.

8. A reaction product according to claim 1 which includes about 60 to about 81% by weight based on solids of a fire retardant.

9. A reaction product to claim 1 wherein said fire retardant is about 20 to about 40% by weight based on solids of antimony trioxide and about 30 to about 50% by weight based on solids of decabromo diphenyloxide.

10. A reaction product according to claim 1 including about 1 to about 6% by weight of a free radical catalyst.

11. A composition according to claim 10 wherein said free-radical catalyst is t-butyl perbenzoate.

12. A reaction product according to claim 10 which has been B-staged.

13. An article made by coating a material with an A-staged reaction product according to claim 10.

14. An article according to claim 13 wherein said material is a fibrous reinforcement.

15. An article according to claim 13 wherein said coated material is B-staged.

16. An article according to claim 15 wherein said composition is cured.

17. A method of preparing an adhesive material comprising:
   (A) adding about 1 to about 6% by weight of a free-radical catalyst to a reaction product according to claim 1;
   (B) coating a material with said reaction product; and
   (C) heating said coated material to B-stage said reaction product.

18. A method according to claim 17 including the additional last step of postcuring said reaction product.

19. A method according to claim 17 wherein said free-radical catalyst is t-butyl perbenzoate.

20. A method according to claim 17 wherein said material is a fibrous reinforcement, including the additional last step of laminating said coated material between copper sheets in a heated nip roll.

21. An article according to claim 13 wherein said material is polyimide film.

22. An article according to claim 21 wherein said A-staged reaction product is sandwiched between two layers of polyimide film.

* * * * *